(12) United States Patent
Jo

(10) Patent No.: US 10,181,733 B2
(45) Date of Patent: Jan. 15, 2019

(54) APPARATUS AND METHOD OF BALANCING VOLTAGES BETWEEN BATTERY RACKS

(71) Applicant: LG CHEM, LTD., Seoul (KR)

(72) Inventor: Yongmin Jo, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 15/522,122

(22) PCT Filed: Dec. 23, 2015

(86) PCT No.: PCT/KR2015/014211
§ 371 (c)(1),
(2) Date: Apr. 26, 2017

(87) PCT Pub. No.: WO2017/111187
PCT Pub. Date: Jun. 29, 2017

(65) Prior Publication Data
US 2017/0373511 A1    Dec. 28, 2017

(51) Int. Cl.
*H02J 7/00* (2006.01)
*B60L 11/18* (2006.01)
*G01R 31/36* (2006.01)
*H01M 10/44* (2006.01)

(52) U.S. Cl.
CPC ............. *H02J 7/0016* (2013.01); *B60L 11/18* (2013.01); *B60L 11/1866* (2013.01); *G01R 31/3658* (2013.01); *H01M 10/44* (2013.01); *H01M 10/441* (2013.01); *H01M 10/446* (2013.01);

(Continued)

(58) Field of Classification Search
None
See application file for complete search history.

(56) References Cited

U.S. PATENT DOCUMENTS 9,142,981 B2   9/2015   Kamata et al.
9,278,622 B2   3/2016   Tagaya et al.
2011/0076525 A1   3/2011   Zhang et al.
(Continued)

FOREIGN PATENT DOCUMENTS

JP   2013-085354 A   5/2013
JP   2014-017997 A   1/2014
(Continued)

OTHER PUBLICATIONS

Extended European Search Report for European Application No. 15907564.7, dated May 30, 2018.

*Primary Examiner* — David V Henze-Gongola
(74) *Attorney, Agent, or Firm* — Birch, Stewart, Kolasch & Birch, LLP

(57) ABSTRACT

The present invention relates to an apparatus and a method of balancing voltages between battery racks, and the apparatus includes: a voltage measuring unit configured to measure a voltage of a plurality of battery racks; a collecting unit configured to collect the measured voltage of the plurality of battery racks; and a control unit configured to control voltage balancing to be performed between two battery racks among the plurality of battery racks based on the collected voltage of the plurality of battery racks, and control the voltage balancing to be repeatedly performed between the battery racks, on which the voltage balancing is performed, and the battery rack, on which the voltage balancing is not performed.

8 Claims, 6 Drawing Sheets

(52) U.S. Cl.
CPC ......... *H01M 10/448* (2013.01); *H02J 7/0014* (2013.01)

(56) References Cited

U.S. PATENT DOCUMENTS

2013/0057224 A1    3/2013  Choi et al.
2014/0312828 A1*   10/2014 Vo ..................... H01M 10/4257
                                                        320/103

FOREIGN PATENT DOCUMENTS

| KR | 10-2009-0092890 A | 9/2009 |
| KR | 10-2014-0122520 A | 10/2014 |
| KR | 10-2014-0143237 A | 12/2014 |
| KR | 10-2015-0089627 A | 8/2015 |
| WO | 2013/065364 A1 | 5/2013 |

* cited by examiner

[Figure 1]
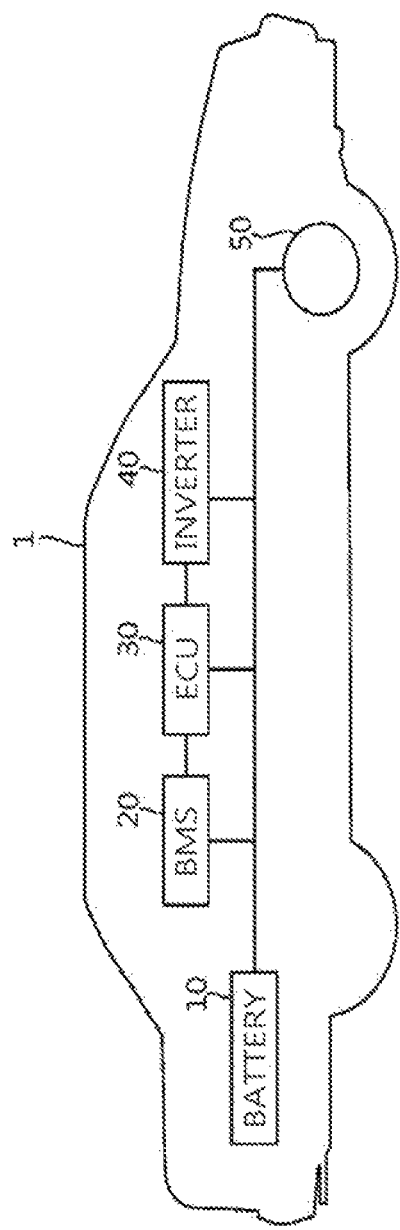

[Figure 2]
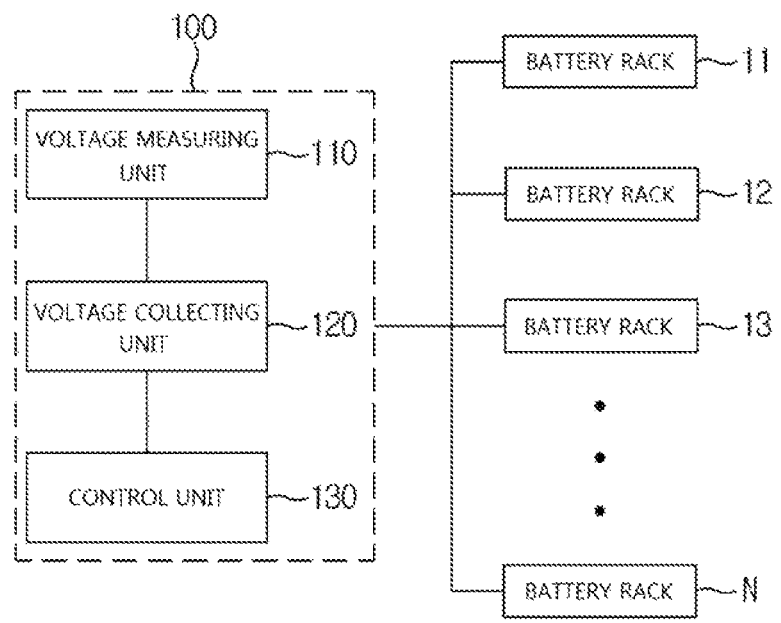

[Figure 3]
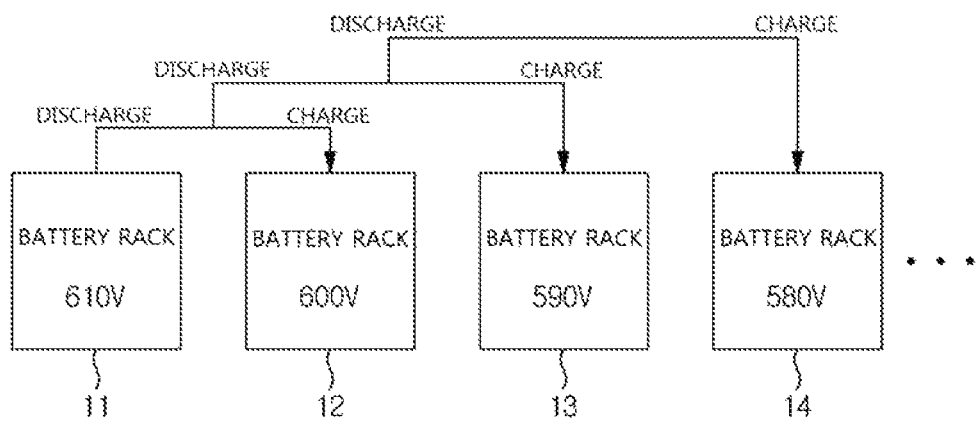

[Figure 4]
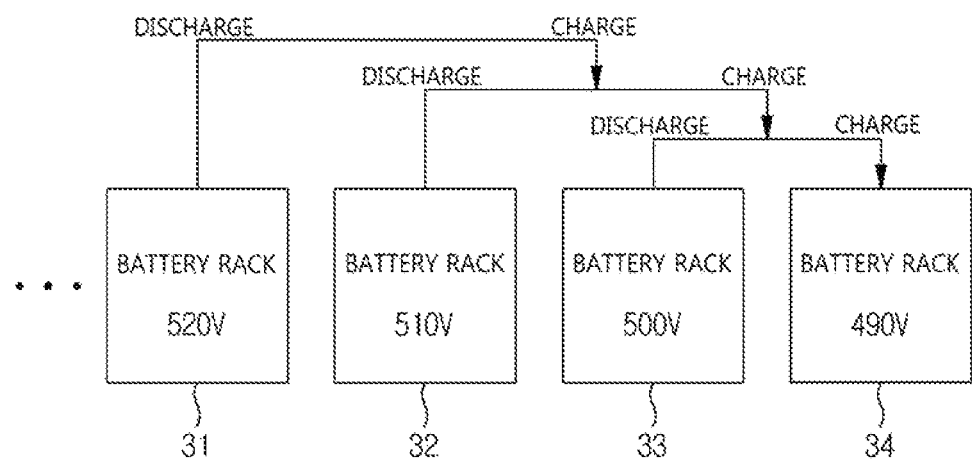

[Figure 5]
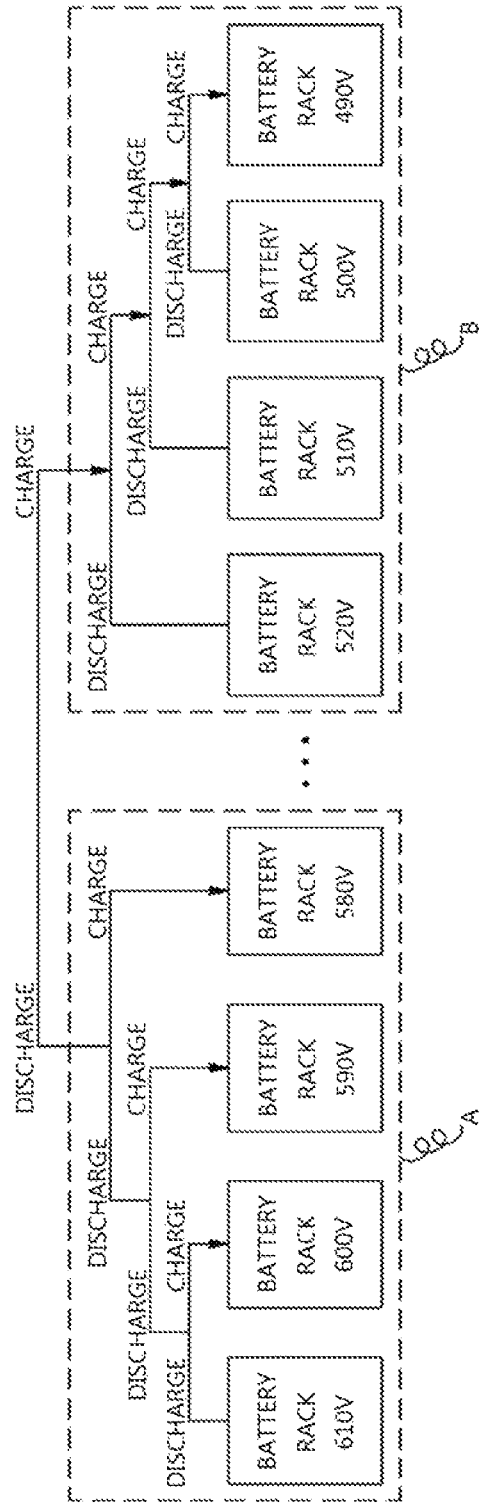

[Figure 6]
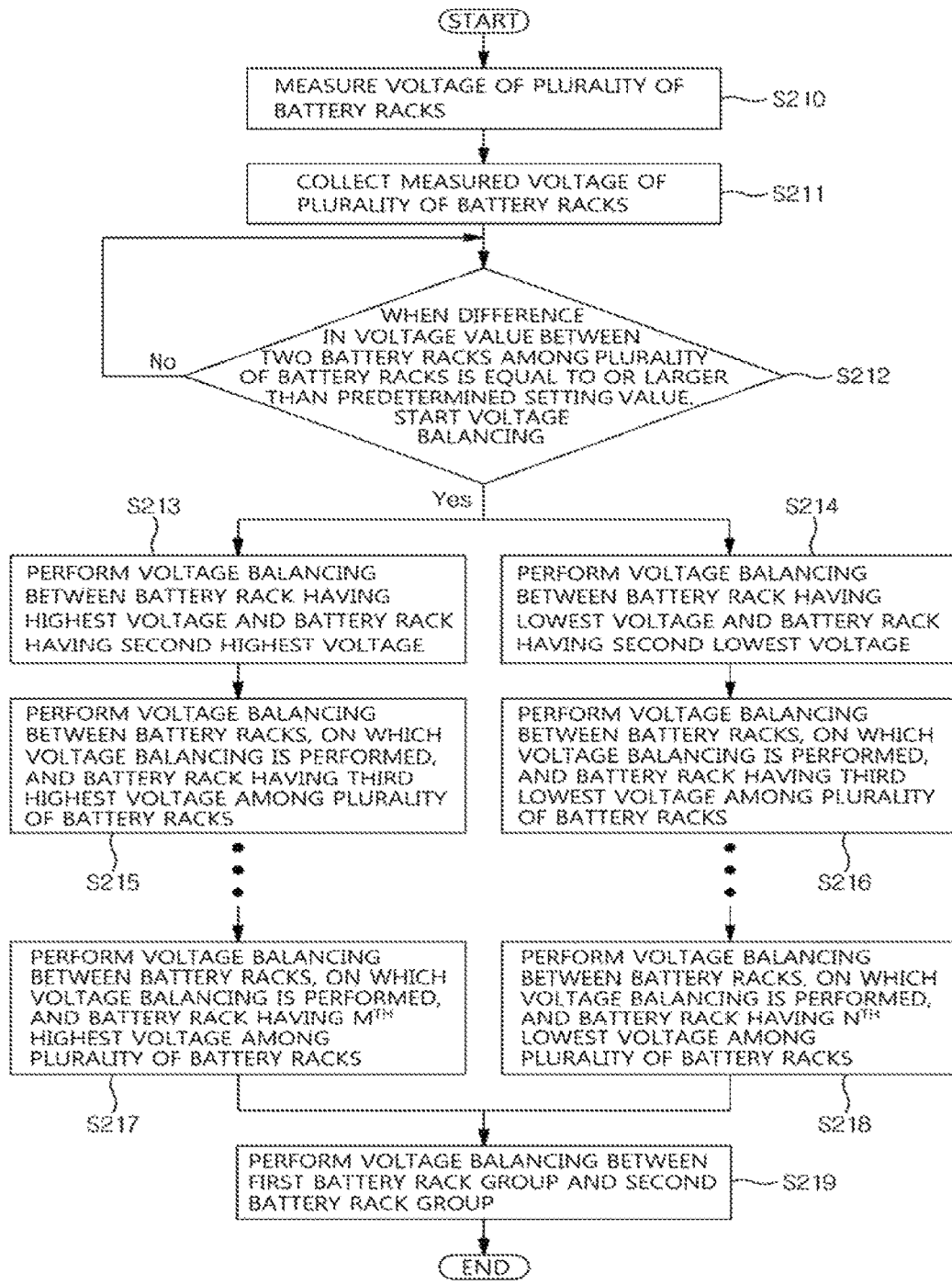

APPARATUS AND METHOD OF BALANCING VOLTAGES BETWEEN BATTERY RACKS

TECHNICAL FIELD

The present invention relates to an apparatus and a method of balancing voltages between battery racks, and more particularly, to an apparatus and a method of balancing voltages between battery racks, which perform voltage balancing between two battery racks among a plurality of battery racks when a difference in a voltage value among the plurality of battery racks is equal to or larger than a predetermined setting value, and repeatedly perform the voltage balancing between the battery racks, on which the voltage balancing is performed, and a battery rack, on which the voltage balancing is not performed, thereby using a whole state of charging (SOC).

BACKGROUND ART

A battery, which has a high application easiness according to a product group, and has an electric characteristic, such as a high energy density, is referred to as a storage battery or a secondary battery, and has been universally applied to an electric vehicle (EV), a hybrid vehicle (HV), and the like driven by an electric driving source, or an energy storage system (ESS), an uninterruptible power supply (UPS) system, or the like driven by an electric driving source, as well as a portable device.

Particularly, in the case of a battery for a vehicle, a plurality of batteries is configured by a serial circuit, and safety, durability, a high output, and the like of the plurality of batteries are influenced by voltage balancing of the battery rack including the battery cells, so that it is necessary to make a voltage of each battery rack be uniform. To this end, there is required voltage balancing between the battery racks so that each battery rack has an appropriate voltage while discharging and charging the battery cells included in the battery racks.

However, the apparatuses and the method for balancing voltages between the battery racks in the related art require a separate power supply device for balancing when a difference in a voltage value between the battery racks is generated, thereby having a problem in a cost aspect.

DETAILED DESCRIPTION OF THE INVENTION

Technical Problem

An object of the present invention is to provide an apparatus and a method of balancing voltages between battery racks, which perform voltage balancing between two battery racks among a plurality of battery racks when a difference in a voltage value among the plurality of battery racks is equal to or larger than a predetermined setting value, and repeatedly perform the voltage balancing between the battery racks, on which the voltage balancing is performed, and a battery rack, on which the voltage balancing is not performed, thereby using a whole state of charging (SOC).

Another object of the present invention is to provide an apparatus and a method of balancing voltages between battery racks, which perform a balancing of voltages between battery racks without using a separate power supply device, thereby decreasing operation costs.

Technical Solution

An apparatus for balancing voltages between battery racks according to an exemplary embodiment of the present invention includes: a voltage measuring unit configured to measure a voltage of a plurality of battery racks; a collecting unit configured to collect the measured voltage of the plurality of battery racks; and a control unit configured to control voltage balancing to be performed between two battery racks among the plurality of battery racks based on the collected voltage of the plurality of battery racks, and control the voltage balancing to be repeatedly performed between the battery racks, on which the voltage balancing is performed, and the battery rack, on which the voltage balancing is not performed.

The control unit may select a battery rack having the lowest voltage and a battery rack having the second lowest voltage from among the plurality of battery racks, discharge the battery rack having the second lowest voltage and charge the battery rack having the lowest voltage by using a discharged current to control the voltage balancing to be performed between the battery rack having the lowest voltage and the battery rack having the second lowest voltage, and select a battery rack having the highest voltage and a battery rack having the second highest voltage from among the plurality of battery racks, discharge the battery rack having the highest voltage and charge the battery rack having the second highest voltage by using a discharged current to control the voltage balancing to be performed between the battery rack having the highest voltage and the battery rack having the second highest voltage.

The control unit may control the voltage balancing to be repeatedly performed between the battery racks, on which the voltage balancing is performed, and a battery rack, which has the closest voltage value to the voltages of the battery racks, on which the voltage balancing is performed, among the battery racks, on which the voltage balancing is not performed.

The control unit may perform the voltage balancing on all of the plurality of battery racks, and control the voltage balancing to be performed between a first battery rack group, on which the voltage balancing is sequentially performed from a high voltage and a second battery rack group, on which the voltage balancing is sequentially performed from a low voltage.

When a difference in a voltage value between two battery racks among the plurality of battery racks is equal to or larger than a predetermined setting value, the control unit may control the voltage balancing to start.

A method of balancing voltages between battery racks according to another exemplary embodiment of the present invention includes: measuring a voltage of a plurality of battery racks; collecting the measured voltage of the plurality of battery racks; and controlling voltage balancing to be performed between two battery racks among the plurality of battery racks based on the collected voltage of the plurality of battery racks, and controlling the voltage balancing to be repeatedly performed between the battery racks, on which the voltage balancing is performed, and the battery rack, on which the voltage balancing is not performed.

The controlling of the voltage balancing to be repeatedly performed may include: selecting a battery rack having the lowest voltage and a battery rack having the second lowest voltage from among the plurality of battery racks, discharging the battery rack having the second lowest voltage and charging the battery rack having the lowest voltage by using a discharged current to control the voltage balancing to be performed between the battery rack having the lowest voltage and the battery rack having the second lowest voltage; and selecting a battery rack having the highest voltage and a battery rack having the second highest voltage from among the plurality of battery racks, discharging the battery rack having the highest voltage and charging the battery rack having the second highest voltage by using a discharged current to control the voltage balancing to be performed between the battery rack having the highest voltage and the battery rack having the second highest voltage.

The controlling of the voltage balancing to be repeatedly performed may further include controlling the voltage balancing to be repeatedly performed between the battery racks, on which the voltage balancing is performed, and a battery rack, which has the closest voltage value to the voltages of the battery racks, on which the voltage balancing is performed, among the battery racks, on which the voltage balancing is not performed.

The controlling of the voltage balancing to be repeatedly performed may further include performing the voltage balancing on all of the plurality of battery racks, and performing the voltage balancing between a first battery rack group, on which the voltage balancing is sequentially performed from a high voltage and a second battery rack group, on which the voltage balancing is sequentially performed from a low voltage.

The controlling of the voltage balancing to be repeatedly performed may further include, when a difference in a voltage value between two battery racks among the plurality of battery racks is equal to or larger than a predetermined setting value, controlling the voltage balancing to start.

Advantageous Effects

According to one aspect of the present invention, it is possible to perform voltage balancing between two battery racks among a plurality of battery racks when a difference in a voltage value among the plurality of battery racks is equal to or larger than a predetermined setting value, and repeatedly perform the voltage balancing between the battery racks, on which the voltage balancing is performed, and a battery rack, on which the voltage balancing is not performed, thereby using a whole state of charging (SOC).

Further, when the voltage balancing is performed between the battery racks, a separate power supply device is not used, thereby decreasing costs.

BRIEF DESCRIPTION OF DRAWINGS

FIG. 1 is a diagram schematically illustrating an electric vehicle, to which an apparatus and a method of balancing voltages between battery racks according to an exemplary embodiment of the present invention are applicable.

FIG. 2 is a view schematically illustrating an apparatus for balancing voltages between battery racks according to an exemplary embodiment of the present invention.

FIG. 3 is a diagram schematically illustrating a first battery group sequentially performing voltage balancing from a high voltage in the apparatus and the method of balancing voltages between battery racks according to the exemplary embodiment of the present invention.

FIG. 4 is a diagram schematically illustrating a second battery group sequentially performing voltage balancing from a lower voltage in the apparatus and the method of balancing voltages between battery racks according to the exemplary embodiment of the present invention.

FIG. 5 is a diagram schematically illustrating the voltage balancing of the first battery group and the second battery group in the apparatus and the method of balancing voltages between battery racks according to the exemplary embodiment of the present invention.

FIG. 6 is a flowchart schematically illustrating a method of balancing voltages between battery racks according to an exemplary embodiment of the present invention.

BEST MODE

The present invention will be described below with reference to the accompanying drawings. Herein, repeated descriptions and the detailed description of a publicly known function and configuration that may make the gist of the present invention unnecessarily ambiguous will be omitted. Exemplary embodiments of the present invention are provided so as to more completely explain the present invention to those skilled in the art. Accordingly, the shape, the size, etc., of elements in the figures may be exaggerated for more clear explanation.

Throughout the specification and the claims, unless explicitly described to the contrary, the word "include/comprise" and variations such as "includes/comprises" or "including/comprising" mean further including other constituent elements, not excluding the other constituent elements.

In addition, the term " . . . unit" described in the specification means a unit for processing at least one function and operation and may be implemented by hardware components or software components and combinations thereof.

An electric vehicle described below refers to a vehicle including one or more electric motors as driving force. Energy used for driving an electric vehicle includes a rechargeable battery and/or an electrical source, such as a fuel cell. The electric vehicle may be a hybrid vehicle using an internal combustion engine as another power source.

FIG. 1 is a diagram schematically illustrating an electric vehicle, to which an apparatus and a method of balancing voltages between battery racks according to an exemplary embodiment of the present invention are applicable.

However, the apparatus and the method of balancing voltages between battery racks according to the exemplary embodiment of the present invention may be applicable to various technical fields, such as an energy storage system (ESS) for family use and/or for an industry or an uninterruptible power supply (UPS) system, to which a battery is applied, as well as the electric vehicle.

The electric vehicle 1 may include a battery 10, a battery management system (BMS) 20, an electronic control unit (ECU) 30, an inverter 40, and a motor 50.

The battery 10 is an electric energy source for driving the electric vehicle 1 by providing driving force to the motor 50. The battery 10 may be charged or discharged by the inverter 40 according to the driving of the motor 50 and/or an internal combustion engine (not illustrated).

Here, the kind of battery 10 is not particularly limited, and examples of the battery 10 may include a lithium ion battery, a lithium polymer battery, a nickel cadmium battery, a nickel hydrogen battery, a nickel zinc battery, and the like.

Further, the battery 10 may be formed of a battery pack, in which a plurality of battery cells is connected in series and/or in parallel. Further, one or more battery packs are provided to form the battery 10.

The BMS 20 may estimate a state of the battery 10, and manage the battery 10 by using information on the estimated state. For example, the BMS 20 may estimate and manage state information about the battery 10, such as a state of charging (SOC), a state of health (SOH), the amount of maximum input/output allowance power, and an output voltage. Further, the BMS 20 may control charging or discharging of the battery 10 by using the state information, and further, may also estimate a replacement time of the battery 10.

Further, the BMS 20 may include an apparatus 100 (see FIG. 2) for balancing voltages between battery racks, which is to be described below. When a difference in a voltage value between the plurality of battery racks is equal to or larger than a predetermined setting value, the BMS 20 performs voltage balancing between two battery racks among the plurality of battery racks, and repeatedly performs the voltage balancing between the battery racks, on which the voltage balancing is performed, and a battery rack, on which the voltage balancing is not performed, thereby using a whole state of charging (SOC) of the battery 10.

The ECU 30 is an electronic control device for controlling a state of the electric vehicle 1. For example, the ECU 30 may determine a torque level based on information about an accelerator, a brake, a speed, and the like, and control an output of the motor 50 so as to correspond to torque information.

Further, the ECU 30 may transmit a control signal to the inverter 40 so that the battery 10 is chargeable or dischargeable based on the state information, such as an SOH and an SOC, of the battery 10 received from the BMS 20.

The inverter 40 makes the battery 10 be charged or discharged based on the control signal of the ECU 30.

The motor 50 may drive the electric vehicle 1 based on control information (for example, the torque information) transmitted from the ECU 30 by using electric energy of the battery 10.

The electric vehicle 1 is driven by using the electric energy of the battery 10, so that it is important to use the SOC by balancing the voltages between the battery racks.

Accordingly, hereinafter, the apparatus and the method of balancing voltages between battery racks according to the present invention will be described with reference to FIGS. 2 to 6.

FIG. 2 is a view schematically illustrating the apparatus 100 for balancing voltages between battery racks according to the exemplary embodiment of the present invention.

Referring to FIG. 2, the apparatus 100 for balancing voltages between battery racks according to the exemplary embodiment of the present invention may include a voltage measuring unit 110, a voltage collecting unit 120, and a control unit 130.

The apparatus 100 for balancing voltages between battery racks illustrated in FIG. 2 may be connected with battery racks 11 to N and measure, collect, and control voltages of the battery racks 11 to N.

Here, each of the battery racks 11 to N may include a plurality of battery cells, and the battery cells may be connected in series or in parallel. As a matter of course, the battery racks 11 to N may be provided in plural to form a battery having a higher output or higher capacity.

The apparatus 100 for balancing voltages between battery racks illustrated in FIG. 2 is in accordance with the exemplary embodiment, and the constituent elements of the apparatus 100 for balancing voltages between battery racks are not limited to the exemplary embodiment illustrated in FIG. 2, and some constituent elements may be added, changed, or deleted as necessary.

The voltage measuring unit 110 measures voltages of the battery racks 11 to N. For example, the voltage measuring unit 110 may be connected to sensing lines at both ends of the battery racks 11 to N to measure voltages of the battery racks 11 to N.

The voltage collecting unit 120 may collect the voltages of the plurality of battery racks 11 to N measured by the voltage measuring unit 110.

The control unit 130 may control the voltage balancing of the battery racks 11 to N to be repeatedly performed based on the voltages of the battery racks 11 to N collected by the voltage collecting unit 120. This will be described in more detail with reference to FIGS. 3 to 5.

FIG. 3 is a diagram schematically illustrating a first battery group sequentially performing the voltage balancing from a high voltage in the apparatus and the method of balancing voltages between battery racks according to the exemplary embodiment of the present invention.

Referring to FIG. 3, the control unit 130 selects the battery rack 11 having the highest voltage and the battery rack 12 having the second highest voltage from among the battery racks 11 to N, and discharges the battery rack 11 having the highest voltage and charges the battery rack 12 having the second highest voltage by using a discharged current, to control the voltage balancing to be performed between the battery rack 11 having the highest voltage and the battery rack 12 having the second highest voltage.

Here, the control unit 130 controls the voltage balancing to be repeatedly performed between the battery racks 11 and 12, on which the voltage balancing is performed, and the battery rack 13, which has the closest voltage value to the voltages of the battery racks 11 and 12, on which the voltage balancing is performed, among the battery racks, on which the voltage balancing is not performed.

For example, in FIG. 3, the control unit 130 controls the voltage balancing to be sequentially and repeatedly performed in such a manner that the voltage balancing is performed between the battery rack 11 having the highest voltage of 610 V and the battery rack 12 having the second highest voltage of 600 V, the voltage balancing is performed between the battery racks 11 and 12 and the battery rack 13, which has the closest voltage value of 590 V to the voltages of the battery racks 11 and 12, on which the voltage balancing is performed, and the voltage balancing is performed between the battery racks 11, 12, and 13 and the battery rack 14, which has the closest voltage value of 580 V to the voltages of the battery racks 11, 12, and 13, on which the voltage balancing is performed.

FIG. 4 is a diagram schematically illustrating a second battery group sequentially performing the voltage balancing from a lower voltage in the apparatus and the method of balancing voltages between battery racks according to the exemplary embodiment of the present invention.

Referring to FIG. 4, the control unit 130 selects the battery rack N having the lowest voltage and the battery rack N−1 having the second lowest voltage from among the battery racks 11 to N, discharges the battery rack N−1 having the second lowest voltage and charges the battery rack N having the lowest voltage by using a discharged current, to control the voltage balancing to be performed between the battery rack N having the lowest voltage and the battery rack N−1 having the second lowest voltage.

Here, the control unit 130 controls the voltage balancing to be repeatedly performed between the battery racks N and N−1, on which the voltage balancing is performed, and the battery rack N−2, which has the closest voltage value to the voltages of the battery racks N and N−1, on which the voltage balancing is performed, among the battery racks, on which the voltage balancing is not performed.

For example, in FIG. 4, the control unit 130 controls the voltage balancing to be sequentially and repeatedly performed in such a manner that the voltage balancing is performed between the battery rack 34 having the lowest voltage of 490V and the battery rack 33 having the second lowest voltage of 500V, the voltage balancing is performed between the battery racks 33 and 34 and the battery rack 32, which has the closest voltage value of 510V to the voltages of the battery racks 33 and 34, on which the voltage balancing is performed, and the voltage balancing is performed between the battery racks 32, 33, and 34 and the battery rack 31, which has the closest voltage value of 520V to the voltages of the battery racks 32, 33, and 34, on which the voltage balancing is performed.

FIG. 5 is a diagram schematically illustrating the voltage balancing of a first battery group A and a second battery group B in the apparatus and the method of balancing voltages between battery racks according to the exemplary embodiment of the present invention.

Here, the control unit 130 controls the voltage balancing to be performed between the first battery group A and the second battery group B by discharging the first battery group A and charging the second battery group B by using the discharged current.

The control unit 130 performs the voltage balancing on the first battery group A and the second battery group B and then terminates the voltage balancing between the battery racks.

FIG. 6 is a flowchart schematically illustrating a method of balancing voltages between battery racks according to an exemplary embodiment of the present invention.

Referring to FIG. 6, when the voltage balancing between battery racks according to the exemplary embodiment of the present invention starts, first, a voltage of a plurality of battery racks is measured (S210). For example, a sensing line may be connected to both ends of the battery racks, thereby measuring voltages of the battery racks.

Next, the measured voltage of the plurality of battery racks is collected (S211).

When a difference in a voltage value between two battery racks among the collected voltage of the plurality of battery racks is equal to or larger than a predetermined setting value, the voltage balancing is controlled to start (S212). Here, when the difference in the voltage value between the battery racks is equal to or less than the predetermined setting value, the operation of determining a difference in a voltage value between the battery racks is controlled to be repeated.

When the voltage balancing starts, the voltage balancing is controlled to be performed between the battery rack having the highest voltage and the battery rack having the second highest voltage (S213), and the voltage balancing is controlled to be performed between the battery racks, on which the voltage balancing is performed, and the battery rack having the third highest voltage among the plurality of battery racks (S215). As described above, the voltage balancing is controlled to be performed up to the battery rack having the $M^{th}$ highest voltage among the plurality of battery racks by controlling the voltage balancing to be sequentially performed according to the voltage value of the battery rack (S217).

Further, similar to the above description, the voltage balancing is controlled to be performed between the battery rack having the lowest voltage and the battery rack having the second lowest voltage (S214), and the voltage balancing is controlled to be performed between the battery racks, on which the voltage balancing is performed, and the battery rack having the third lowest voltage among the plurality of battery racks (S216). Here, the voltage balancing is also controlled to be performed up to the battery rack having the $N^{th}$ lowest voltage among the plurality of battery racks by controlling the voltage balancing to be sequentially performed according to the voltage value of the battery rack (S218).

In the exemplary embodiment, the sequential performance of the voltage balancing from the high voltage and the sequential performance of the voltage balancing from the low voltage may be performed at the same time.

Then, the voltage balancing is also controlled to be performed between a first battery rack group, on which the voltage balancing is sequentially performed from the high voltage and a second battery rack group, on which the voltage balancing is sequentially performed from the low voltage, and the voltage balancing between the battery racks is terminated.

As described above, when a difference in a voltage value between the plurality of battery racks is equal to or larger than a predetermined setting value, the apparatus and the method of balancing voltages between battery racks perform the voltage balancing between two battery racks among the plurality of battery racks, and repeatedly perform the voltage balancing between the battery racks, on which the voltage balancing is performed, and a battery rack, on which the voltage balancing is not performed, thereby using a whole SOC of the battery, and decreasing costs.

In the above description, the technical spirit of the present invention is simply illustrative, and those skilled in the art may change and modify the present invention in various ways without departing from the essential characteristic of the present invention. Accordingly, the various exemplary embodiments disclosed herein are not intended to limit but describe the technical spirit of the present invention, and the scope of the technical spirit of the present invention is not limited by the exemplary embodiment. The scope of the present invention should be construed based on the following appended claims and it should be construed that the technical spirit included within the scope equivalent to the claims belongs to the scope of the right of the present invention.

The invention claimed is:

1. A battery management system for balancing voltages between battery racks, the battery management system comprising:
 a sensor configured to measure a voltage of a plurality of battery racks,
 wherein the battery management system is configured to:
  collect the measured voltage of the plurality of battery racks,
  a control voltage balancing to be performed between two battery racks among the plurality of battery racks based on the collected voltage of the plurality of battery racks, and control the voltage balancing to be repeatedly performed between the two battery racks and a battery rack among the plurality of battery racks different than the two battery racks,
  select a battery rack having the lowest voltage and a battery rack having the second lowest voltage from among the plurality of battery racks, discharge the battery rack having the second lowest voltage and charge the battery rack having the lowest voltage by using a discharged current to control the voltage balancing to be performed between the battery rack having the lowest voltage and the battery rack having the second lowest voltage, and select a battery rack having the highest voltage and a battery rack having the second highest voltage from among the plurality of battery racks, discharge the battery rack having the highest voltage and charge the battery rack having the second highest voltage by using a discharged current to control the voltage balancing to be performed between the battery rack having the highest voltage and the battery rack having the second highest voltage.

2. The apparatus of claim 1, wherein the battery management system controls the voltage balancing to be repeatedly performed between the two battery racks and a battery rack, which has the closest voltage value to the voltages of the two battery racks.

3. The apparatus of claim 2, wherein the battery management system performs the voltage balancing on all of the plurality of battery racks, and controls the voltage balancing to be performed between a first battery rack group, on which the voltage balancing is sequentially performed from a high voltage and a second battery rack group, on which the voltage balancing is sequentially performed from a low voltage.

4. The apparatus of claim 1, wherein when a difference in a voltage value between two battery racks among the plurality of battery racks is equal to or larger than a predetermined setting value, the battery management system controls the voltage balancing to start.

5. A method of balancing voltages between battery racks, the method comprising:

measuring a voltage of a plurality of battery racks;

collecting the measured voltage of the plurality of battery racks; and controlling voltage balancing to be performed between two battery racks among the plurality of battery racks based on the collected voltage of the plurality of battery racks, and controlling the voltage balancing to be repeatedly performed between the two battery racks and a battery rack among the plurality of battery racks different than the two battery racks, wherein the controlling of the voltage balancing to be repeatedly performed includes:

selecting a battery rack having the lowest voltage and a battery rack having the second lowest voltage from among the plurality of battery racks, discharging the battery rack having the second lowest voltage and charging the battery rack having the lowest voltage by using a discharged current to control the voltage balancing to be performed between the battery rack having the lowest voltage and the battery rack having the second lowest voltage; and selecting a battery rack having the highest voltage and a battery rack having the second highest voltage from among the plurality of battery racks, discharging the battery rack having the highest voltage and charging the battery rack having the second highest voltage by using a discharged current to control the voltage balancing to be performed between the battery rack having the highest voltage and the battery rack having the second highest voltage.

6. The method of claim 5, wherein the controlling of the voltage balancing to be repeatedly performed further includes controlling the voltage balancing to be repeatedly performed between the battery racks, on which the voltage balancing is performed, and a battery rack, which has the closest voltage value to the voltages of the battery racks, on which the voltage balancing is performed.

7. The method of claim 6, wherein the controlling of the voltage balancing to be repeatedly performed further includes performing the voltage balancing on all of the plurality of battery racks, and performing the voltage balancing between a first battery rack group, on which the voltage balancing is sequentially performed from a high voltage and a second battery rack group, on which the voltage balancing is sequentially performed from a low voltage.

8. The method of claim 5, wherein the controlling of the voltage balancing to be repeatedly performed further includes, when a difference in a voltage value between two battery racks among the plurality of battery racks is equal to or larger than a predetermined setting value, controlling the voltage balancing to start.

* * * * *